United States Patent [19]

Hauenstein

[11] Patent Number: 4,683,438

[45] Date of Patent: Jul. 28, 1987

[54] CIRCUIT FOR CONNECTING A LOAD TO THE HIGH SIDE OF A DC POWER SUPPLY

[75] Inventor: Alfred Hauenstein, Munich, Fed. Rep. of Germany

[73] Assignee: Siemens Aktiengesellschaft, Berlin and Munich, Fed. Rep. of Germany

[21] Appl. No.: 861,488

[22] Filed: May 9, 1986

[30] Foreign Application Priority Data

May 10, 1985 [DE] Fed. Rep. of Germany ....... 3516936

[51] Int. Cl.$^4$ ................................................ G05F 1/56
[52] U.S. Cl. .................................... 323/288; 323/283
[58] Field of Search ............... 323/282, 283, 284, 285, 323/288; 307/246, 270, 296 A

[56] References Cited

U.S. PATENT DOCUMENTS 4,420,700 12/1983 Fay et al. ............................ 323/282
4,603,269 7/1986 Hochstein ........................... 307/270

FOREIGN PATENT DOCUMENTS 3209070 8/1983 Fed. Rep. of Germany .

Primary Examiner—Peter S. Wong
Assistant Examiner—Judson H. Jones
Attorney, Agent, or Firm—Mark H. Jay

[57] ABSTRACT

A circuit in which an n-channel MOS transistor is employed between load and the positive pole of an operating voltage source has the following drive circuit: parallel to the switching transistor and the load there is connected an RC-network. Both capacitors have a common junction at gate potential and are voltage limited. The gate is connected to the output of the inverter which can be switched between the source potential $U_{S1}$ and $U_{S1}+U_{C1}$. A diode path is connected in parallel with C1 and in parallel with C2 there is an oscillator having a push-pull output which is connected through a capacitor between D3 and D4. Such a drive requires no external auxiliary voltage, allows for static and dynamic circuit drive as well as randomly high drive voltages and permits integration with well known techniques.

Principal application area: Network circuit components, actuator setting, motor controls, switching of loads in control technology and in motor vehicles.

10 Claims, 2 Drawing Figures

CIRCUIT FOR CONNECTING A LOAD TO THE HIGH SIDE OF A DC POWER SUPPLY

BACKGROUND OF THE INVENTION

The invention relates to a circuit for connecting a load to the high side of a DC power supply.

In many instances — e.g. in the case of switching network components, motor controls (half and full bridge), in motor vehicles or in control technology — a load must be connected to the positive side of the voltage supply. If an n-channel MOSFET is employed, it is necessary to use a gate voltage about 10 V above line voltage in order to attain full control.

A drive circuit for this purpose is discussed in German Offenlegungsschrift 32 09 070. There, a voltage step-up oscillator, provided with windings, derives a control voltage from the operating voltage. The control voltage is thereupon connected through by a microprocessor-controlled preamplifier stage. A disadvantage of this circuit is, however, that an auxiliary voltage must be generated. This in turn requires a transformer which contains coils and a core. For a number of reasons (limited integration capability, difficult mounting, substantial space requirement and high cost), this transformer should be eliminated if possible. Coilless "bootstrap" voltage step-up circuits are well known but they provide only for a dynamic circuit drive. P-channel MOS transistor technology would provide an especially simple circuit, but this approach is too expensive.

One object of the invention is to provide a circuit of this type that requires no additional external auxiliary voltage source, needs no inductors, and can be used in an integrated circuit.

Another object is, in general, to improve on known devices of this type.

SUMMARY OF THE INVENTION

In accordance with the invention, a first RC network containing a first capacitor is placed in parallel with the drain-source path of an n-channel MOSFET which serves as a switching transistor through which current through the load is regulated. A second RC network is placed in parallel with the load and the capacitors in the two RC networks have a common junction point. An inverter has its input connected to receive voltage across the first capacitor in the first RC network and its output connected to the gate of the MOSFET, and a trickle charger is connected to charge this first capacitor when the MOSFET is conductive.

Because the first capacitor is prevented from discharging, the MOSFET can be turned on and off by essentially grounding and ungrounding the inverter input.

In the preferred embodiment, the switching transistor can be controlled to its minimum turn-on resistance. The power loss is relatively low, whether the current through the load is being turned on and off, or whether the current is being continuously regulated to achieve a desired average value between zero and maximum. Because of high peak current capability, high switching frequencies are possible. The operating voltage may easily be hundreds of volts. A number of components require off-state voltages which are less than 30 V, so that incorporation of the preferred embodiment into an integrated circuit is feasible.

Advantageously, the switching transistor can be protected by means of dynamic load current limiting. This is advantageous for loads which have relatively high inductive or capacitive characteristics.

BRIEF DESCRIPTION OF THE DRAWINGS

Exemplary and non-limiting preferred embodiments of the invention are shown in the drawings, in which.

DETAILED DESCRIPTION OF PREFERRED EMBODIMENTS

Figure 1:
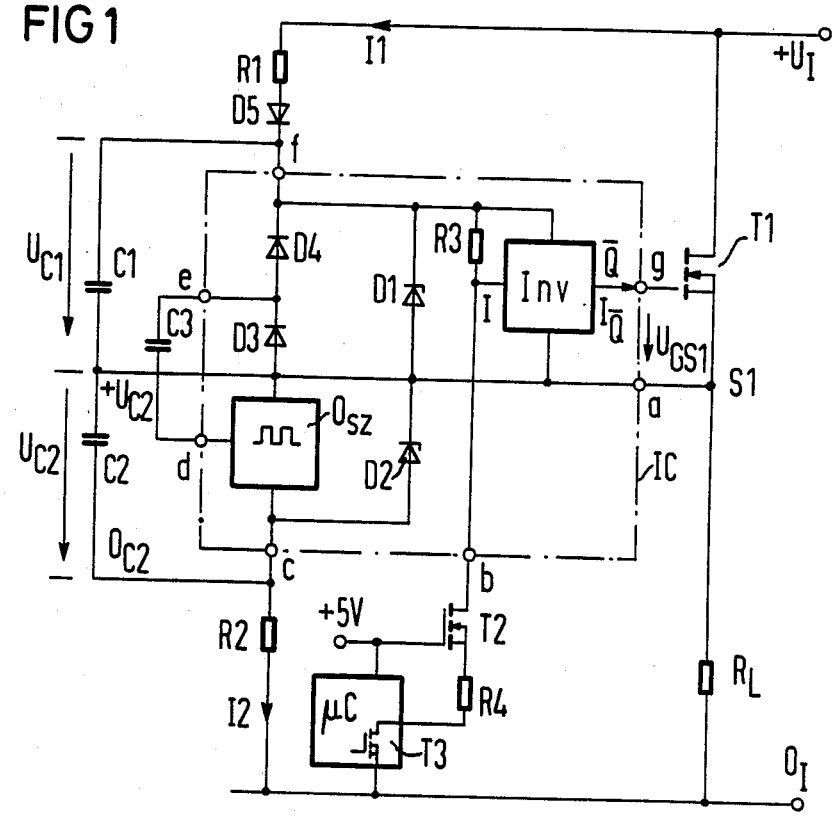
FIG. 1 is a schematic diagram of a preferred embodiment.

The circuit shown in FIG. 1 serves to connect and disconnect a load $R_L$ having a static and dynamic resistance on the order of 100 ohms to the positive side $+U_I$ of a 250 V to 350 V DC voltage supply (not shown). One side of the load is connected to the negative side $O_I$ of the voltage source; a p-switching n-channel MOSFET switching transistor T1 is connected between the other side of the load and the positive side $+U_I$. A series circuit including a resistance R1 (50K ohms/2 W), a diode D5 and a capacitor C1 (220 nF/16 V) is connected in parallel with the switching transistor T1, and an additional series circuit including capacitor C2 (220 nF/16 V) and a resistance R2 (40K ohms/2 W) is connected across the load $R_L$. The capacitors C1 and C2 have a common connection S1 to the gate of the switching transistor T1. In parallel with C1 are a 12 V Zener diode D1 as well as a diode string (D3 with a breakdown voltage of ±15 V and D4 with a breakdown voltage of ±30 V). In parallel with C2 are an additional 12 V Zener diode D2 and a 50 kHz oscillator.

The voltage $U_{C1}$ is supplied to an inverter Inv through the resistor R1 and the diode D5. The input I of the inverter Inv is connected to a voltage divider. The voltage divider, which lies between the supply voltage connection and the negative pole $O_I$ is made up of the resistance R3 (10k ohms), as well as a MOSFET T2 ($U_{DS} \pm 400$ V), in series with a resistance R4 (1.8k ohms) and an additional MOSFET T3 integrated into a microprocessor $\mu C$.

The components enclosed in the dashed rectangle designated with the inputs a through g in the Figure can be put together into a single integrated circuit.

The circuit, in which $R_{DSon}$ of the switching transistor T1 may be neglected, operates as follows.

When the operating voltage is applied and T3 (and therefore T1) is turned off, a current I1 flows through R1 and D5 into C1, whose voltage $U_{C1}$ is limited by D1 to 12 V, and further through $R_L$ to $O_I$. Since $R_L$ is much less than R1 and R2, the current flowing through C2 and R2 is negligibly small and results in practically no voltage build-up on C2. As long as the circuit branch which includes T2, R4 and T3 is at high resistance, the voltage at the input I of the inverter Inv is high and the gate source voltage $U_{GS1}$ at the output Q of the inverter Inv is therefore zero.

To switch on the transistor T1, R4 is connected to $O_I$. This is done by turning on the transistor T3 using the microprocessor $\mu C$. This causes the potential at the input of the inverter Inv to fall below the threshold value. Thereupon the inverter output voltage $U_{GS1}$ rises to $+U_{C1} = +12$ V, with the result that the switching transistor T1 becomes conducting and its source potential rises to $+U_I$. During this phase the potential at the input of the inverter Inv can fall below the voltage level at point S1; this condition is non-critical, because the current through T2, R4 and T3 is limited.

Since C1 is still charged, the input I of the inverter Inv is held low and the switching transistor T1 continues to conduct because its gate is high. In order to maintain conduction of the switching transistor T1 for longer periods, the charge on C1 is periodically refreshed through a special trickle charging circuit (Osz, C2, C3, D2, D3 and D4). This operates in the following manner. After the switching transistor T1 is switched on, C2 charges. The charging current 12 flows from the source S1 through C2 and R2 to $O_I$, and Zener diode D2 limits the capacitor voltage UC2 to e.g., 12 V. As soon as the desired voltage is attained, the oscillator starts up independently and alternately switches the two input voltages ($O_{C2}$, $+U_{C2}$) to C3 at point d. If d is at $O_{C2}$, C3 is charged by current from C2 flowing through D3. If d is at the potential of $+U_{C2}$, C3 is charged through D4, following C1, when $U_{C1}$ is less than ($U_{C2}-U_{DS}-U_{D4}$) (i.e. less than the total voltage drop across $C_2$, $T_2$ and $D_4$). The diode D5 thereby prevents C1 from discharging by providing it with approximately 0.3 mA when the transistor T1 is conducting; diode D5 may not be needed, especially if C3 has a relatively high value.

In order to cut off D1 the output of the microprocessor $\mu C$ is made low ohmic. The inverter output then shorts the voltage $U_{GS1}$ with the result that T1 turns off and C1 is charged in the manner described.

The drive circuit has a total power dissipation not exceeding 2W, under all drive conditions. The current $I_Q$ delivered to the switching transistor by the inverter Inv has a value of at least 200 mA.

Figure 2:
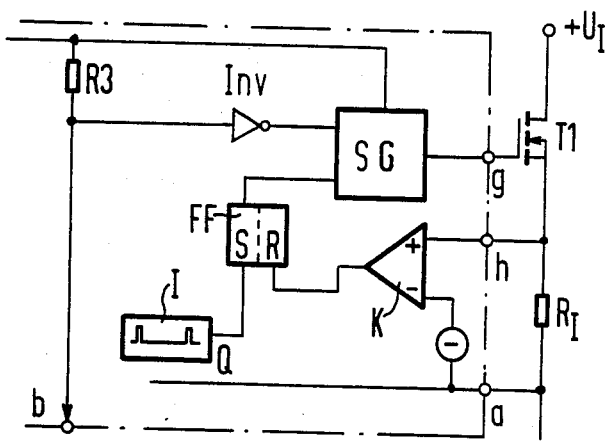
FIG. 2 is a block diagram of a dynamic current limiter for use in the circuit of FIG. 1.

As shown in FIG. 2, the described circuit may be provided with dynamic load current limiting. For this purpose an input of an AND gate SG is connected to a flip-flop FF, which is energized by a pulse generator I and a comparator K. The comparator K receives a reference voltage of +300 mV, for example, at its negative input and a voltage value at its positive input which is reduced by the resistance $R_I$ in series with $R_L$. When this voltage drop is higher than the reference voltage, the comparator K resets the flip-flop FF; T1 is thereby turned off. After a period of time determined by the pulse generator I, FF is again set, so that T1 is again switched on. This process continues until the source of the over-current is eliminated. The flip-flop FF, comparator K, reference voltage source and the pulse generator I, which may eventually be the oscillator $O_{SZ}$, may be integrated, if required.

Those skilled in the art will understand that changes can be made in the preferred embodiments here described, and that these embodiments can be used for other purposes. Such changes and uses are within the scope of the invention, which is limited only by the claims which follow.

What is claimed is:

1. A circuit for connecting a load to a high side of a DC power supply, comprising:

an n-channel MOSFET between said high side and said load;
    a first RC network containing a first capacitor, said first RC network being in parallel with the drain-source path of the MOSFET;
    a second RC network containing a second capacitor, said second RC network being in parallel with the load and connected such that the first and second capacitors are connected together;
    an inverter with an input connected to that plate of the first capacitor which is unconnected to the second capacitor and with an output connected to the gate of the MOSFET; and
    means for trickle-charging said first capacitor.

2. The circuit of claim 1, further comprising a voltage divider with a tap to which the inverter input is connected and with a branch of variable resistance between said tap and a low side of said power supply.

3. The circuit of claim 2, wherein said branch includes the drain-source paths of first and second FETs, the source of the first FET being connected to a low side of the power supply and the drain-source path of the second FET being located between said tap and said first FET and the gate of the second FET being connected to a fixed voltage.

4. The circuit of claim 3, further comprising a microprocessor which is connected to the gate of the first FET.

5. The circuit of claim 1, further comprising first and second Zener diodes connected across the first and second capacitors respectively to limit the maximum voltages thereacross.

6. The circuit of claim 1, wherein the first RC network includes a first resistor and a diode connected between said first resistor and said first capacitor.

7. The circuit of claim 1, wherein the first and second RC networks contain first and second resistors respectively and said first and second resistors have resistances which are at least 100 times the resistance of the load.

8. The circuit of claim 1, further comprising means for limiting current through the MOSFET to a predetermined maximum value.

9. The circuit of claim 8, wherein said limiting means comprises:

a current sensing resistor connected in series with the drain-source path of said MOSFET;
    a comparator connected to said current sensing resistor and comparing voltage thereacross with a predetermined reference voltage;
    a pulse generator;
    a flip-flop with one input connected to the output of the comparator and another input connected to the pulse generator; and
    means for controlling the conduction of the MOSFET in accordance with the logical state of an output of the flip-flop.

10. The circuit of claim 9, wherein said pulse generator is connected to said trickle-charging means.

* * * * *